United States Patent
Yamakawa et al.

[11] Patent Number: 5,292,552
[45] Date of Patent: Mar. 8, 1994

[54] METHOD FOR FORMING METALLIZED LAYER ON AN ALUMINUM NITRIDE SINTERED BODY

[75] Inventors: Akira Yamakawa; Akira Sasame, both of Hyogo, Japan

[73] Assignee: Sumitomo Electric Industries, Ltd., Osaka, Japan

[21] Appl. No.: 902,446

[22] Filed: Jun. 19, 1992

Related U.S. Application Data

[63] Continuation of Ser. No. 628,210, Dec. 17, 1990, abandoned.

[30] Foreign Application Priority Data

Dec. 20, 1989 [JP] Japan ................. 1-331726

[51] Int. Cl.5 ............................. B05D 3/02
[52] U.S. Cl. ........................ 427/229; 427/376.3; 106/1.12
[58] Field of Search ............ 427/229, 383.3, 397.7, 427/376.3, 376.6; 428/328, 432, 433, 469, 627, 665, 698, 701, 704, 901; 501/15, 17, 32; 106/1.12

[56] References Cited

U.S. PATENT DOCUMENTS

| | | | |
|---|---|---|---|
| 4,800,137 | 1/1989 | Okuno et al. | 428/698 |
| 4,835,039 | 5/1989 | Barringer et al. | 501/17 |
| 4,883,780 | 11/1989 | Kasori et al. | 501/96 |
| 4,886,709 | 12/1989 | Sasame et al. | 428/627 |
| 4,965,659 | 10/1990 | Sasame et al. | 357/81 |

FOREIGN PATENT DOCUMENTS

| | | |
|---|---|---|
| 0265231 | 4/1988 | European Pat. Off. |
| 0276788 | 8/1988 | European Pat. Off. |
| 58-11390 | 3/1983 | Japan. |
| 63-115393 | 5/1988 | Japan. |
| 2162167 | 1/1986 | United Kingdom ........ 428/901 |

*Primary Examiner*—Terry J. Owens
*Attorney, Agent, or Firm*—W. G. Fasse; D. H. Kane, Jr.

[57] ABSTRACT

An aluminum nitride sintered body that has been fired/formed to have a prescribed sintered configuration, is used as a substrate. A metal paste of tungsten is prepared and applied to the substrate. The metal paste of tungsten contains oxide components of at least 1 percent by weight of the paste and not more than 40 percent by weight of the paste. The oxide components include $SiO_2$ of at least 1 percent by weight of the oxide components and not more than 40 percent by weight of the oxide components. The oxide components include CaO and $Al_2O_3$ in a weight ratio of at least 0.5 and not more than 2 of CaO to $Al_2O_3$. The aluminum nitride sintered body coated with the metal paste is heated/fired in a non-oxidizing atmosphere at a temperature of at least 1400° C. and not more than 2000° C.

4 Claims, 2 Drawing Sheets

METHOD FOR FORMING METALLIZED LAYER ON AN ALUMINUM NITRIDE SINTERED BODY

This application is a continuation of application Ser. No. 07/628,210, filed on Dec. 17, 1990, now abandoned.

FIELD OF THE INVENTION

The present invention relates to a method of forming a metallized layer on a surface of an aluminum nitride sintered body, and more particularly, it relates to a method of forming a metallized layer containing tungsten as a metal component.

BACKGROUND INFORMATION

In recent years, semiconductor devices have been highly integrated while achieving an increased operating speed. The degree of integration has been extremely improved particularly in LSI. Thus, the heat radiation property of the material of the substrate for carrying a semiconductor element has been increasingly emphasized.

A ceramic material for such an IC substrate has been generally made of alumina ($Al_2O_3$). However, a conventional alumina sintered body has a low thermal conductivity and an insufficient heat radiation property. Thus, it is difficult to use such an alumina sintered body as a ceramic material for making a substrate, which can sufficiently cope with an increase in the calorific power of an IC chip.

In place of such an alumina substrate, attention has recently been directed to a substrate or a heat sink which is made of aluminum nitride having a high thermal conductivity, and much effort has been made to put the same into practice.

Aluminum nitride is a material essentially having a high thermal conductivity and a high insulation ability, with no toxicity dissimilarly to beryllia, and which does have a high thermal conductivity but is toxic. Thus, aluminum nitride is suitable as an insulating material or a package material for a semiconductor device. However, an aluminum nitride sintered body having the aforementioned characteristics is disadvantageous since it does not provide a satisfactory junction strength with respect to a metal or vitreous material. An aluminum nitride sintered body may be provided with a metallized layer on its surface, by a thick film forming method of directly applying commercially available metallized paste onto the surface of the aluminum nitride sintered body, or by a thin film forming method whereby a metal or an active metal layer is formed by a technique such as a vapor deposition. For practical purposes, so-formed metallized layers do not attain a sufficient junction strength with respect to the aluminum nitride sintered body. In practice, therefore, it is necessary to reform the surface of the aluminum nitride sintered body by some technique before or during the metallization step, in order to improve the junction strength between the metallized layer and a metal, for example.

In a well-known conventional method for such reforming, an oxide layer is formed by oxidizing a surface of an aluminum nitride sintered body.

For example, Japanese Patent Publication No. 58-11390 (1983) discloses a method of forming an oxide layer of $SiO_2$, $Al_2O_3$, mullite, $Fe_2O_3$ and the like on a surface of an aluminum nitride sintered body. However, although such an oxide layer has an excellent affinity with respect to a glass layer, an alumina layer etc., it may be inferred that the same has a small affinity with respect to the aluminum nitride sintered body itself and has a questionable reliability. The term "reliability" in this context means that the junction or peel strength between the oxide layer and the aluminum nitride sintered body involves no "dispersion", in other words is uniform over the entire surface, so that a constant junction or peel strength can be maintained in a prescribed heat cycle test, and the like.

On the other hand, Japanese Laying-Open No. 63-115393 (1988) discloses a method of applying a conductive paste which is mainly composed of tungsten and/or molybdenum and an agent for reinforcing the junction strength prepared from an oxide mixture of $SiO_2$, $AlO_2$ and $CaO$ onto an aluminum nitride sintered body and thereafter firing the same at a temperature of at least 1600° C. However, the problem of this method is that the firing temperature is too high and the so-formed metallized layer has a rather insufficient reliability.

SUMMARY OF THE INVENTION

It is an object of the present invention to provide a method for forming a metallized layer on an aluminum nitride sintered body, in such a way that the formed metallized layer assures a high junction strength and a high reliability at a lower firing temperature.

The method of the present invention forms a metallized layer on a surface of an aluminum nitride sintered body, by the following steps:

(a) preparing an aluminum nitride sintered body previously fired/formed to have a prescribed sintered configuration;

(b) preparing a metal paste of tungsten and oxide components including at least $SiO_2$, $CaO$, and $Al_2O_3$ present in said metal paste within the range of at least 1 percent by weight of said metal paste and not more than 40 percent by weight of said metal paste, said oxide components including said $SiO_2$ in a content of at least 1 percent by weight of said oxide components and not more than 40 percent by weight of said oxide components, said $CaO$ being present in a weight ratio of at least 0.5 and not more than 2.0 relative to $Al_2O_3$;

(c) applying the metal paste onto the surface of the aluminum nitride sintered body; and (d) heating/firing the aluminum nitride sintered body coated with the metal paste in a non-oxidizing atmosphere under a temperature of at least 1400° C. and not more than 2000° C. These ranges of the oxide components of the present invention define the optimum range of such oxide components with regard to the adhering or peel strength as described below.

According to the present method of forming a metallized layer, the metal paste having the prescribed composition is applied onto a surface of an aluminum nitride sintered body by screen printing or the like, and the applied paste is then fired. The metal paste is mainly composed of oxide components and a metal conductor component of tungsten dispersed in an organic substance of ethyl cellulose resin or acrylic resin and a solvent for the resin. The oxide components are important elements in the present method of forming a metallized layer. As mentioned, the oxide components include $Al_2O_3$, $CaO$ and $SiO_2$. The metal paste contains at least 1 percent by weight and not more than 40 percent by weight of such oxide components, whereby the weight % relates to the metal paste. If the content of the oxide components is less than 1 percent by weight of the metal paste, the junction strength of the so-formed metallized layer with respect to the aluminum nitride sintered body is reduced and a plated layer formed on the surface of the metallized layer is significantly blistered or stained during plating. If the content of the oxide components exceeds 40 percent by weight of the paste, on the other hand, an oxide layer is formed on a surface of the so-formed metallized layer which makes the plating difficult and the plated layer is blistered or stained. The content of the oxide components contained in the metal paste is preferably selected so that the lower limit is at least 10 percent by weight of the paste while the upper limit is preferably not more than 30 percent by weight of the paste. If the content of the oxide components is within this range, it is possible to obtain a metallized layer which has a particularly high junction or bonding or peel strength and an excellent platability.

The oxide components include $SiO_2$ in a content of at least 1 percent by weight of the oxide components and not more than 40 percent by weight of the oxide components. In such oxide components, the weight ratio ($CaO/Al_2O_3$) of CaO with respect to $Al_2O_3$ is at least 0.5 and not more than 2. Further, if the content of $SiO_2$ exceeds 40 percent by weight of the oxide components, the adhesive strength between the as-formed metallized layer and the aluminum nitride sintered body is reduced. If the content of $SiO_2$ is less than 1 percent by weight of the oxide components, on the other hand, the formed metallized layer deteriorates during plating of its surface and the adhesive strength with respect to the aluminum sintered body is reduced. Further, if the weight ratio of CaO to $Al_2O_3$ exceeds 2, the adhesive strength of the metallized layer with respect to the aluminum nitride sintered body is also reduced. If the weight ratio of CaO to $Al_2O_3$ is less than 0.5, on the other hand, a glass component is remarkably raised during heating or firing.

Oxides of elements belonging to the groups I, II, III and IV of the periodic table, such as MgO, $Nd_2O$, $Y_2O_3$, $TiO_2$ and $B_2O_3$, for example, may be added to the metal paste having the aforementioned composition. The oxides contained in the metal paste may be previously mixed, heated and vitrified to be then added to the metal paste. Alternatively, each oxide may be independently kneaded with tungsten. Further, each oxide contained in the metal paste may be mixed with tungsten in the form of a compound such as carbonate. While tungsten is employed as a conductor component for the metal paste in the present method of forming a metallized layer, it is preferable to use fine tungsten particles. In particular, a metallized layer having a high junction strength can be obtained by using metal powder of fine particles and coarse particles which are mixed to be not more than 1 μm in mean particle size. Further, a transition metal element may be added to the metal paste in an amount of not more than 1 percent by weight of the paste, in order to facilitate the firing of the tungsten.

The components forming the metal paste are sufficiently kneaded with each other by a ball mill, a triple-roll mill or the like. The so formed metal paste is applied onto a surface of the aluminum nitride sintered body by screen printing, brush application or the like. The aluminum nitride sintered body thus coated with the metal paste is then dried and heated/fired in a non-oxidizing atmosphere at a temperature of at least 1400° C. and not more than 2000° C. If the firing temperature is less than 1400° C., the sintered body is insufficiently fired and the junction strength of the formed metallized layer with respect to the aluminum nitride sintered body, is reduced. The firing temperature is preferably in a range of at least 1500° C. and not more than 1600° C., in order to attain high junction strength.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

EXAMPLE 1

Ethyl cellulose and butyl carbitol were added to tungsten powder materials having particle size distributions shown in Table 1 and oxide components, and sufficiently kneaded by a triple-roll mill, to prepare samples of metal paste. The particle size distributions shown in Table 1 are indicated by the expression "0.5/1.0; R 1:1" of sample No. 1, for example, indicates that tungsten particles of 0.5 μm and 1.0 μm in mean particle size are mixed in a weight ratio of R=1:1. Further, "0.5 only" for sample No. 14, for example, indicates that the tungsten powder was prepared from only particles of 0.5 μm in mean particle size. As to sample No. 19, nickel powder was added to the tungsten powder in a mixing ratio 0.5:99.5 of nickel to tungsten in weight percentage. As to sample No. 20, molybdenum powder was added to the tungsten powder in a mixing ratio of 10:90 of molybdenum to tungsten in weight percentage.

The tungsten paste materials were applied to sintered carriers of aluminum nitride containing 99 percent by weight of AlN by screen printing, to form pads of 2 mm by 2 mm in application area. The samples were then heated/fired in accordance with the firing conditions shown in Table 1. Referring to Table 1, "$N_2$–$5H_2$" indicates that $N_2$ gas and $H_2$ gas were mixed in a volume ratio of 95:5.

Nickel-plated layers of 1.0 μm in thickness were formed on the surfaces of the so formed metallized layers. Lead frames of 2 mm in width and 0.1 mm in thickness were silver-brazed on the nickel-plated layers. The lead frames were pulled in prescribed directions, in order to measure peel strength values.

Figure 1:
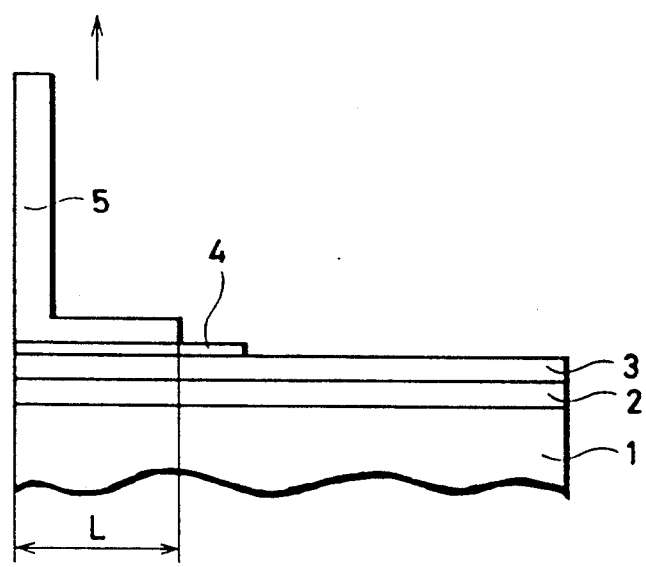
FIG. 1 is a side elevational view showing a method measuring the peel or adhesive strength of a lead frame which is joined onto an aluminum nitride sintered carrier through a metallized layer as taught herein.

FIG. 1 shows a method of measuring the peel strength. A metallized layer 2 is formed on an aluminum nitride sintered carrier 1. A nickel-plated layer 3 is formed on the metallized layer 2. A lead frame 5 is joined onto the nickel-plated layer 3 by a silver solder member 4. Referring to FIG. 1, symbol L denotes a length of 1.7 mm. Said width of 2 mm and said length of 1.7 mm providing an area of 3.4 mm$^2$.

The lead frame 5 is pulled at a rate of 20 mm/min. upwardly as indicated by the arrow, in order to measure the peel strength. Table 1 also shows the peel strength values measured in the aforementioned manner. Samples 1, 6 and 7 shown with an asterisk (*) are reference examples. As understood from Table 1 the metallized layers formed according to the present method have an excellent junction strength, with peel strength values of at least 4 kg per 3.4 mm$^2$, and preferably at least 5 kg per 3.4 mm$^2$, please also see FIG. 2. Dividing 5 by 3.4 results in a peel strength of 1.47 kg/mm$^2$.

EXAMPLE 3

Tungsten particles of 0.5 μm and 1.0 μm in mean particle size were mixed in a weight ratio of 1:1, to prepare a tungsten powder for a metal paste. Al$_2$O$_3$ powder, CaO powder and SiO$_2$ powder of 0.5 μm in mean particle size were blended in weight ratios of 45:45:10 and sufficiently mixed to prepare an oxide component powder. The tungsten powder and the oxide component powder were mixed with each other in various ratios, while ethyl cellulose and butyl carbitol were added to the mixtures and sufficiently kneaded, to prepare samples of metal paste materials. The so formed

TABLE 1

| Sample No. | Particle Size Distribution of Tungsten | Oxide Components (wt. %) | | | | | Firing Conditions | | | peel strength (kg/3.4 mm$^2$) |
|---|---|---|---|---|---|---|---|---|---|---|
| | | Total | Al$_2$O$_3$ | CaO | SiO$_2$ | Others | gas | temperature (°C.) | Time (min.) | |
| *1 | 0.5/1.0; R = 1:1 | 0.5 | 40 | 40 | 20 | | N$_2$—5H$_2$ | 1550 | 60 | 2 |
| 2 | " | 1.5 | " | " | " | | " | " | " | 5 |
| 3 | " | 10 | " | " | " | | " | " | " | 9 |
| 4 | " | 20 | " | " | " | | " | " | " | 12 |
| 5 | " | 35 | " | " | " | | " | " | " | 8 |
| *6 | " | 45 | " | " | " | | " | " | " | 4 |
| *7 | " | 10 | " | " | " | | " | 1350 | " | 2 |
| 8 | " | " | " | " | " | | " | 1450 | " | 5 |
| 9 | " | " | " | " | " | | " | 1700 | " | 6 |
| 10 | " | " | " | " | " | | " | 1900 | " | 5 |
| 11 | " | " | " | " | " | | H$_2$ | 1550 | " | 9 |
| 12 | " | " | " | " | " | | N$_2$ | " | " | 10 |
| 13 | 1.0/3.0; R = 1:1 | " | " | " | " | | " | " | " | 7 |
| 14 | 0.5 only | " | " | " | " | | " | " | " | 6 |
| 15 | 3.0 only | " | " | " | " | | " | " | " | 4 |
| 16 | 0.5/1.0; R = 1:1 | 20 | " | " | 19 | B$_2$O$_3$:1 | " | " | " | 9 |
| 17 | " | " | " | " | 19 | MgO:1 | " | " | " | 10 |
| 18 | " | " | " | " | 15 | Y$_2$O$_3$:5 | " | " | " | 11 |
| 19 | " | " | " | " | " | | " | " | " | 10 |
| 20 | " | " | " | " | " | | " | " | " | 8 |

EXAMPLE 2

Al$_2$O$_3$, CaO and SiO$_2$ were mixed in various compounding ratios and kneaded with tungsten powder materials having prescribed particle size distributions, to contain 15 percent by weight of oxide components. The tungsten powder materials were prepared to contain particles of 0.4 μm and 1.5 μm in mean particle size in a weight ratio of 1:1 respectively. Metallized layers were formed on surfaces of aluminum nitride sintered bodies by the formed tungsten paste materials, similarly to Example 1. These samples were fired in a nitrogen gas atmosphere at a temperature of 1550° C.

Figure 2:
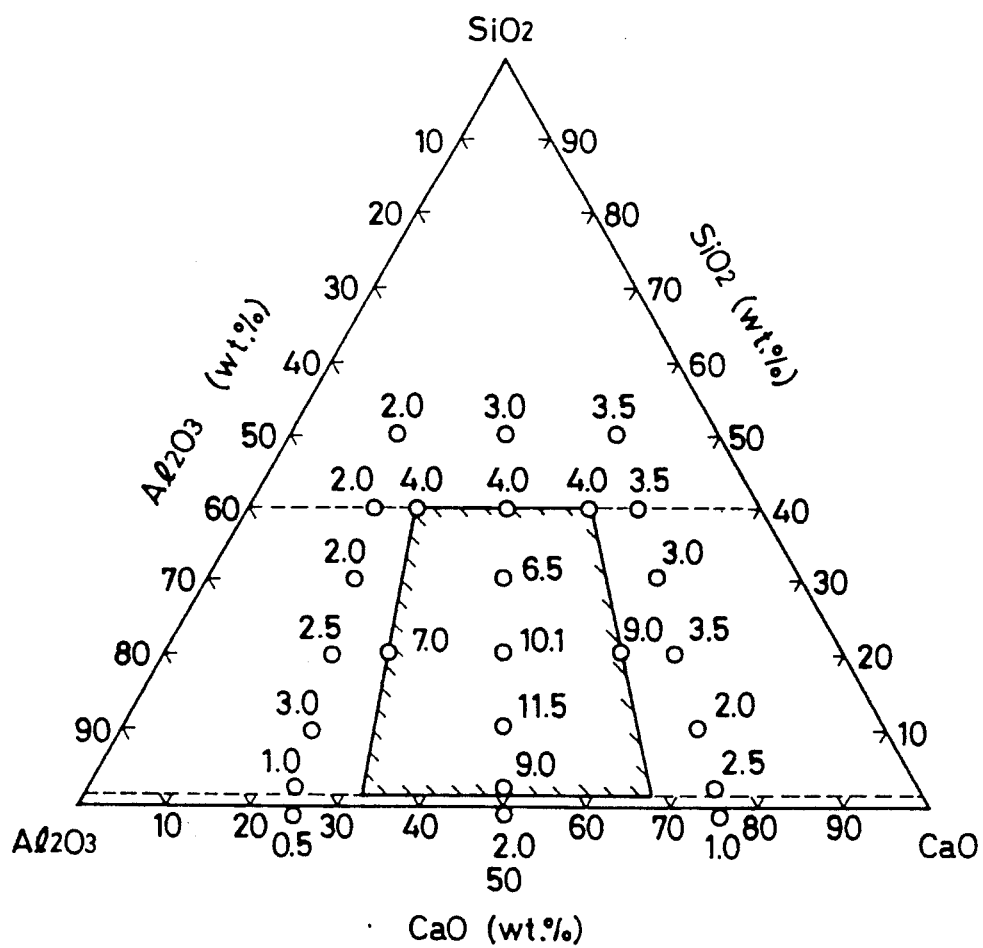
FIG. 2 is a ternary composition diagram of $SiO_2$, $AlO_3$ and CaO, in which peel strength values are plotted corresponding to the compositions of oxide components contained in the metal paste employed in the present invention.
Figure 3:
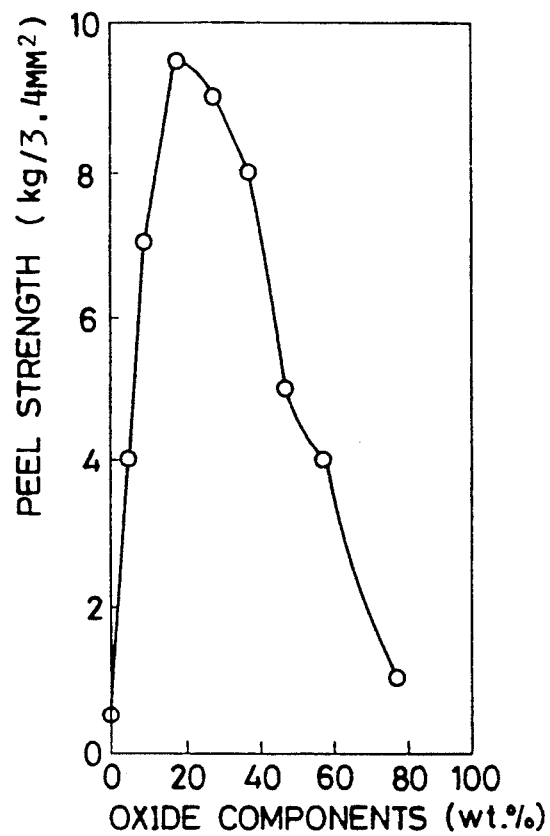
FIG. 3 is a graph showing the peel strength in kg as a function of the content of oxide components contained in the metal paste.

Lead frames were joined onto the respective samples similarly to Example 1, in order to measure peel strength values. FIG. 2 shows the results of the measured peel strength values, corresponding to compounding ratios of the oxide components contained in the respective samples of metal paste materials. FIG. 2 is a ternary composition diagram (wt. %) of SiO$_2$, Al$_2$O$_3$ and CaO. The peel strength values of the respective samples are plotted in numerical values in kg/3.4 mm$^2$ according to the dimensions of the test sample. Referring to FIG. 2, hatched lines enclose a range of compositions of the oxide components substantially according to the present invention, however with peel strengths of less than about 4 kg/3.4 mm$^2$ outside the range of the invention. As understood from FIG. 2, the metallized layers formed by the metal paste materials having oxide components according to the present invention exhibit junction strength values of at least 4.0 kg/3.4 mm$^2$ as peel strength values.

tungsten paste materials were applied to sintered carriers of aluminum nitride having a thermal conductivity of 180 W/m °K and containing at least 99 percent by weight of AlN, by screen printing, similarly to Example 1. Thereafter the samples were heated/fired in N$_2$ gas at a temperature of 1530° C. for one hour. In order to evaluate the so formed metallized layers, peel strength values were measured similarly to Example 1. FIG. 3 shows the results of the measured peel strength values in kg per 3.4 mm$^2$ according to the dimensions of the test sample. As clearly understood from FIG. 3, the junction strength of such a metallized layer is further improved when the content of the oxide components is in a range of 10 to 30 percent by weight of the paste.

EXAMPLE 4

Figure 4:
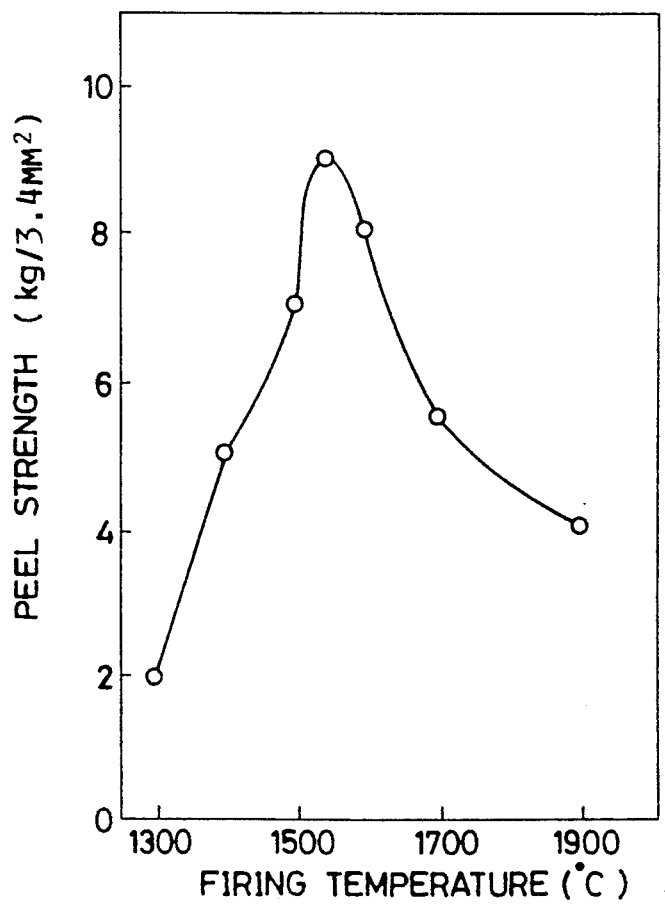
FIG. 4 is a graph showing the peel strength in kg as a function of the firing temperatures.

The tungsten paste materials containing 10 percent by weight of oxide components prepared in Example 3 were applied to aluminum nitride sintered carriers by screen printing, similarly to Example 1. Thereafter the samples were heated/fired in N$_2$ —50% H$_2$, at various temperatures. In order to evaluate the so formed metallized layers, the peel strength values were measured similarly to Example 1. FIG. 4 shows the results of the measured peel strength values in kg/3.4 mm$^2$ according to the dimensions of the test samples. As clearly understood from FIG. 4, the junction strength of such a metallized layer is further improved when the firing temperature is in a range of 1500° to 1600° C.

EXAMPLE 5

10 percent by weight of the oxide component powder materials having prescribed compounding ratios, which were prepared in Example 3, were sufficiently kneaded with tungsten powder materials having particle size distributions shown in Table 2 similarly to Example 1, to prepare samples of metal paste materials. The so formed tungsten paste materials were applied to aluminum nitride sintered carriers similarly to Example 3, and thereafter heated/fired at a temperature of 1550° C. In order to evaluate the so formed metallized layers, the peel strength values were measured similarly to Example 1. Table 2 also shows the results of the measured peel strength values in kg/3.4 mm$^2$.

TABLE 2

| Sample No. | Particle Size Distribution of Tungsten | Mean Particle Size (μm) | Peel Strength (kg/3.4 mm$^2$) |
|---|---|---|---|
| 51 | 0.5/1.0 = 2/1 | 0.67 | 9 |
| 52 | 0.5/1.0 = 1/1 | 0.75 | 10 |
| 53 | 0.5/1.5 = 1/1 | 1.0 | 8 |
| 54 | 0.5/2.0 = 1/1 | 1.3 | 6 |
| 55 | 0.5 only | — | 5 |
| 56 | 2.0 only | — | 4 |

Referring to Table 2, the particle size distributions of tungsten are expressed similarly to Table 1.

As clearly understood from Table 2, a metallized layer having higher junction strength can be obtained when the tungsten powder is not more than 1 μm in mean particle size.

Although the present invention has ben described and illustrated in detail, it is clearly understood that the same is by way of illustration and example only and is not to be taken by way of limitation, the spirit and scope of the present invention being limited only by the terms of the appended claims.

We claim:

1. A method of increasing the peel strength between a metallized layer and a surface of an aluminum nitride sintered body, comprising the steps of:
    (a) forming and sintering an aluminum nitride body to provide a sintered aluminum nitride body;
    (b) preparing a metal paste of tungsten and oxide components including at least $SiO_2$, CaO, and $Al_2O_3$ present in said metal paste within the range of at least 10 percent by weight and not more than 40 percent by weight of said metal paste, said oxide components including said $SiO_2$ in a content of at least 1 percent by weight and not more than 30 percent by weight of said oxide components, said CaO being present in a weight ratio of at least 0.5 and not more than 2.0 relative to said $Al_2O_3$;
    (c) applying said metal paste onto said surface of said aluminum nitride sintered body; and
    (d) firing said aluminum nitride sintered body coated with said metal paste in a non-oxidizing atmosphere at a temperature of at least 1500° C. and less than 1600° C., whereby said peel strength between said metallized layer and said aluminum nitride sintered body is at least 1.47 kg/mm$^2$.

2. The method of claim 1, wherein said metal paste contains an upper limit of said oxide components not more than 30 percent by weight of said metal paste.

3. The method of claim 1, wherein said step of preparing said metal paste of tungsten includes a step of kneading tungsten powder with said oxide components.

4. The method of claim 3, wherein said tungsten powder contains particles having a mean particle size of not more than 1 μm.

* * * * *